US006836184B1

(12) United States Patent
Daughtry et al.

(10) Patent No.: US 6,836,184 B1
(45) Date of Patent: Dec. 28, 2004

(54) NETWORK AMPLIFIER WITH MICROPROCESSOR CONTROL

(75) Inventors: Earl A. Daughtry, Lawrenceville, GA (US); Kazem Memarzadeh, Suwanee, GA (US); Glen Backes, Savage, MN (US); Jeffrey O. Brown, St. Paul, MN (US); Thomas Baxter Harton, IV, Alpharetta, GA (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 09/608,360

(22) Filed: Jun. 30, 2000

Related U.S. Application Data

(60) Provisional application No. 60/142,266, filed on Jul. 2, 1999.

(51) Int. Cl.[7] ............................. H03G 3/20; H03G 3/30; H03F 3/04
(52) U.S. Cl. ........................ 330/144; 330/284; 330/304
(58) Field of Search ................................. 330/144, 145, 330/284, 304; 333/81 R

(56) References Cited

U.S. PATENT DOCUMENTS 3,388,338 A    6/1968  Austin
3,528,023 A    9/1970  Jeffers (List continued on next page.)

FOREIGN PATENT DOCUMENTS

| DE | 123 255  | 12/1976 |
| EP | 281113   | 9/1988  |
| WO | 98/54893 | 12/1998 |

OTHER PUBLICATIONS

Daughtry et al., "High Dynamic Range RF Detector with Temperature Compensation", U.S. patent application Ser. No. 09/607,832, filed Jun. 30, 2000, pp. 1–15, 4 pgs of Figures.

"Siemans Application note on Silicon PIN Diodes", Jul., 1994.

*Primary Examiner*—Patricia Nguyen
(74) *Attorney, Agent, or Firm*—David N. Fogg; Fogg and Associates, LLC

(57) ABSTRACT

A network amplifier is provided. The network amplifier includes a variable equalizer having at least one control input and a variable attenuator having at least one control input. The network amplifier also includes at least one amplifier circuit that is coupled in series with the variable equalizer and the variable attenuator in a signal path of the network amplifier. The network amplifier also includes an automatic gain control circuit with a processor that monitors signals in the signal path and generates control signals for the control input of the variable equalizer and the control input of the variable attenuator to control at least one characteristic of the network amplifier.

17 Claims, 4 Drawing Sheets

U.S. PATENT DOCUMENTS

| | | |
|---|---|---|
| 3,663,898 A | 5/1972 | Kao et al. |
| 3,796,952 A | 3/1974 | Bayer |
| 4,075,576 A | 2/1978 | Eden |
| 4,160,134 A | 7/1979 | Carroll |
| 4,178,559 A | 12/1979 | Nichols |
| 4,208,640 A | 6/1980 | van der Meijs |
| 5,214,505 A | 5/1993 | Rabowsky et al. |
| 5,220,419 A | 6/1993 | Sklar et al. |
| 5,291,150 A | 3/1994 | Saarnimo et al. |
| 5,339,081 A | 8/1994 | Jefferis et al. |
| 5,349,304 A | 9/1994 | Ryat |
| 5,506,910 A * | 4/1996 | Miller et al. .................. 381/103 |
| 5,521,560 A | 5/1996 | Burns et al. |
| 5,592,470 A | 1/1997 | Rudrapatna et al. |
| 5,656,978 A | 8/1997 | Bianu et al. |
| 5,745,159 A * | 4/1998 | Wax et al. ..................... 725/76 |
| 5,789,993 A | 8/1998 | Comte et al. |
| 5,796,309 A | 8/1998 | Nguyen |
| 5,877,653 A | 3/1999 | Kim et al. |
| 6,021,160 A * | 2/2000 | Kaku et al. .................. 375/231 |
| 6,108,527 A | 8/2000 | Urban et al. |
| 6,133,965 A | 10/2000 | Dobrovolny |
| 6,160,452 A | 12/2000 | Daughtry et al. |
| 6,289,063 B1 * | 9/2001 | Duxbury ..................... 375/348 |
| 6,326,848 B1 | 12/2001 | Daughtry et al. |
| 6,339,356 B1 | 1/2002 | Daughtry et al. |
| 6,473,603 B1 | 10/2002 | Toncich et al. |
| 6,549,087 B1 | 4/2003 | Hoang et al. |
| 2002/0159605 A1 * | 10/2002 | Yoshino et al. |

* cited by examiner

NETWORK AMPLIFIER WITH MICROPROCESSOR CONTROL

CROSS REFERENCE TO RELATED APPLICATIONS

This application is related to the following commonly-assigned, co-pending applications:

U.S. application Ser. No. 09/121,244, entitled Circuits and Methods For A Monitoring Circuit in a Network Amplifier, and filed on Jul. 23, 1998;

U.S. application Ser. No. 09/229,234, entitled Variable Equalizer, and filed on Jan. 12, 1999;

U.S. application Ser. No. 60/142,267, entitled Variable Attenuator, and filed on Jul. 2, 1999;

U.S. application Ser. No. 60/142,288, entitled RF Detector, and filed on Jul. 2, 1999;

U.S. application Ser. No. 09/609,076, entitled Variable Attenuator, and filed on even date herewith; and U.S. application Ser. No. 09/607,832, entitled High Dynamic Range RF Detector with Temperature Compensation, and filed on even date herewith.

Each of these applications is incorporated herein by reference.

This application is also related to and claims the benefit of the filing date of co-pending provisional application Serial No. 60/142,266 (the '266 Application), filed on Jul. 2, 1999. The '266 Application is incorporated by reference.

TECHNICAL FIELD OF THE INVENTION

The present invention relates generally to the field of telecommunications and, in particular, to a network amplifier for a cable network.

BACKGROUND

Cable networks are a common medium for providing video, audio and other data or programming to subscribers. Conventionally, cable networks have one or more head ends that transmit signals to subscribers over a medium that includes coaxial cable. Cable networks typically provide subscribers with programming on a variety of channels. Each channel occupies a distinct frequency band on the coaxial cable.

Signals transmitted over a coaxial cable tend to attenuate or decrease in signal strength or magnitude as the signals propagate away from the head end. Cable networks typically include network amplifiers that are placed at various locations in the cable network. The network amplifiers increase the magnitude of the signals to compensate for the attenuation due to the distance that the signals have propagated.

The network amplifiers typically are formed of a number of circuit components that are interconnected on a printed circuit board. Once the amplifier is installed, the housing is sealed and the amplifier cannot be modified without opening the housing. Unfortunately, this may be a difficult and sometimes labor intensive process. Further, many of the circuit components can only be changed (e.g., the amount of attenuation provided by an attenuation pad) by replacing the part.

For the reasons stated above, and for other reasons stated below which will become apparent to those skilled in the art upon reading and understanding the present specification, there is a need in the art for an improved network amplifier.

SUMMARY

The above mentioned problems with network amplifiers and other problems are addressed by the present invention and will be understood by reading and studying the following specification. A network amplifier is described which uses a microprocessor to control a variable attenuator and a variable equalizer to provide automatic gain control for the network amplifier.

DETAILED DESCRIPTION

The following detailed description refers to the accompanying drawings which form a part of the specification. The drawings show, and the detailed description describes, by way of illustration specific illustrative embodiments in which the invention may be practiced. These embodiments are described in sufficient detail to enable those skilled in the art to practice the invention. Other embodiments may be used and logical, mechanical and electrical changes may be made without departing from the scope of the present invention. The following detailed description is, therefore, not to be taken in a limiting sense.

I. First Embodiment of a Network Amplifier

Figure 1:
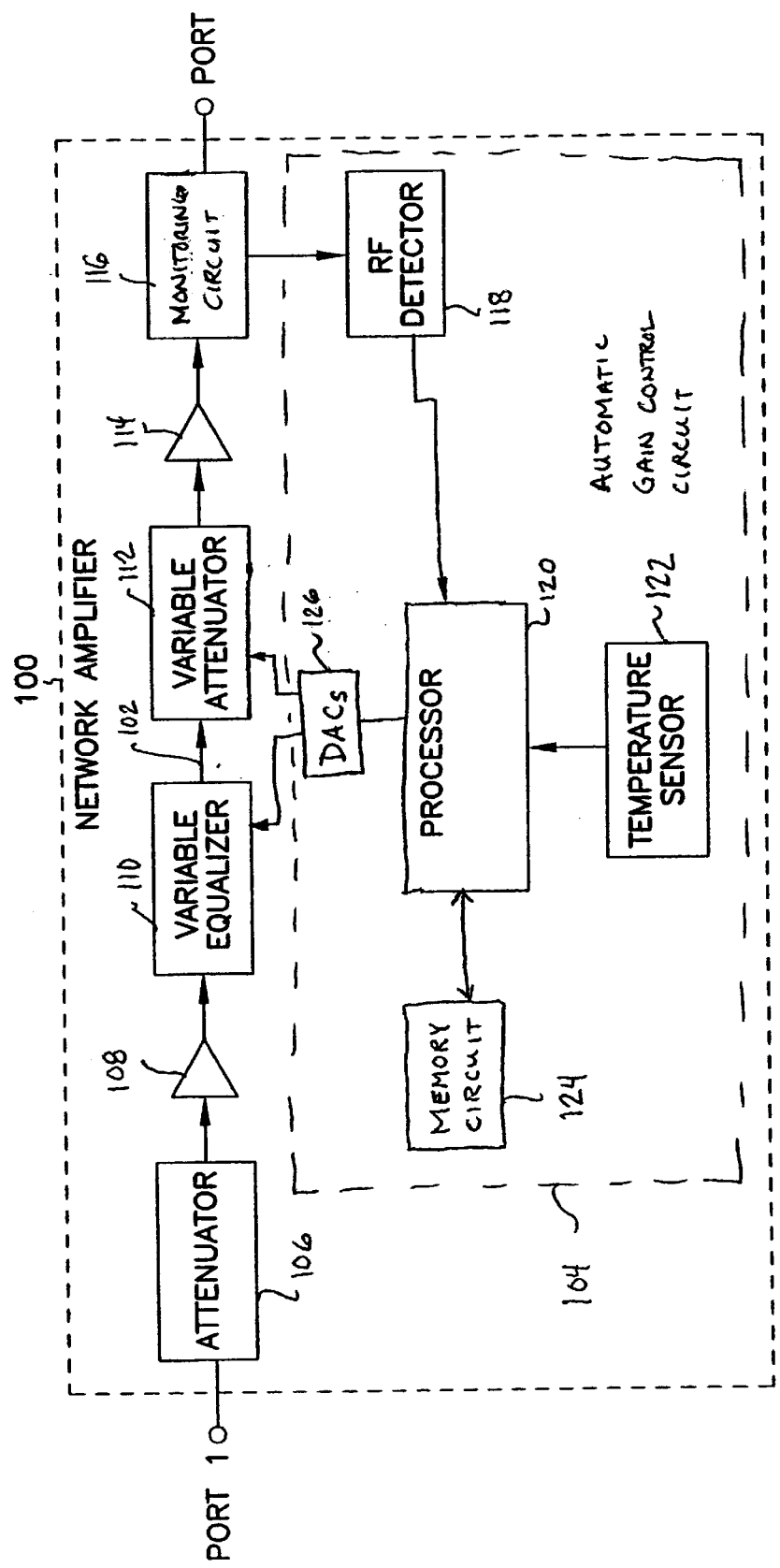
FIG. 1 is a block diagram of one embodiment of a network amplifier constructed according to the teachings of the present invention.

FIG. 1 is a block diagram of one embodiment of a network amplifier, indicated generally at 100, and constructed according to the teachings of the present invention. Network amplifier 100 includes a main signal path 102 between PORT 1 and PORT 2. The slope and gain of signal path 102 are controlled by automatic gain control circuit 104. Advantageously, automatic gain control circuit 104 includes microprocessor 120 that generates control signals as needed to adjust the gain and slope in signal path 102 to keep network amplifier 100 operating within specified parameters.

A. The Signal Path

Signal path 102 passes signals between PORT 1 and PORT 2 of network amplifier 100. Network amplifier 100 is a bi-directional amplifier. For simplicity, however, FIG. 1 shows only the forward portion of signal path 102. It is understood, that signal path 102 also includes a reverse path for passing upstream signals from PORT 2 to PORT 1.

Signal path 102 provides amplification, with adjustable gain and slope or tilt, for RF signals transported between PORT 1 and PORT 2. Signal path 102 includes attenuator 106 that receives signals at PORT 1. Signal path 102 also includes amplifier stages 108 and 114 that are coupled in series with variable equalizer 110 and variable attenuator 112 between attenuator 106 and PORT 2.

Variable equalizer 110 is constructed as shown and described in commonly assigned, co-pending U.S. application Ser. No. 09/229,234 (the "'234 Application), entitled Variable Equalizer, and filed on Jan. 12, 1999. The '234

Application is incorporated herein by reference. Essentially, variable equalizer 110 is controlled by at least one control signal from automatic gain control circuit 104 to provide a specified tilt setting for network amplifier 100.

Variable attenuator 112 is constructed as shown and described in co-pending U.S. application Ser. No. 60/142,267, entitled Variable Attenuator, and filed on Jul. 2, 1999 and co-pending U.S. application Ser. No. 09/609,076, entitled Variable Attenuator, and filed on even date herewith. Variable attenuator 112 is controlled by at least one control signal from automatic gain control circuit 104 to provide a specified attenuation to the signals in signal path 102.

Monitoring circuit 116 is coupled to signal path 102 to monitor RF signals. Advantageously, monitoring circuit 116 is constructed as shown and described in commonly assigned, co-pending U.S. application Ser. No. 09/121,244 (the "'244 Application"), entitled Circuits and Methods For A Monitoring Circuit in a Network Amplifier, and filed on Jul. 23, 1998. Monitoring circuit 116 thus monitors the level of signals in signal path 102 without insertion loss associated with a conventional directional coupler. However, it is understood that a conventional circuit, such as a directional coupler, could be used to monitor the signals in signal path 102 with insertion loss.

B. Automatic Gain Control Circuit

In one embodiment, automatic gain control circuit 104 controls the gain and slope of signal path 102 of network amplifier 100. Automatic gain control circuit 104 includes RF detector 118 that measures the level of signals from monitoring circuit 116. RF detector 118 is constructed as shown and described in co-pending U.S. application Ser. No. 60/142,288, entitled RF Detector, and filed on Jul. 2, 1999 and U.S. application Ser. No. 09/607,832, entitled High Dynamic Range RF Detector with Temperature Compensation, and filed on even date herewith.

Automatic gain control circuit 104 further includes processor 120, temperature sensor 122 and memory circuit 124. In one embodiment, processor 120, temperature sensor 122, and memory circuit 124 implement the functionality of the processor, sensor and memory of the RF detector shown and described in the cited Applications for RF detector 118. Thus, RF detector 118 may include a diode detector circuit that provides raw data to processor 120. Processor 120 processes the data from RF detector 118 to produce a value for the level of the signal in signal path 102 as described in the cited applications. In one embodiment, temperature sensor 122 comprises a thermistor.

Figure 2:
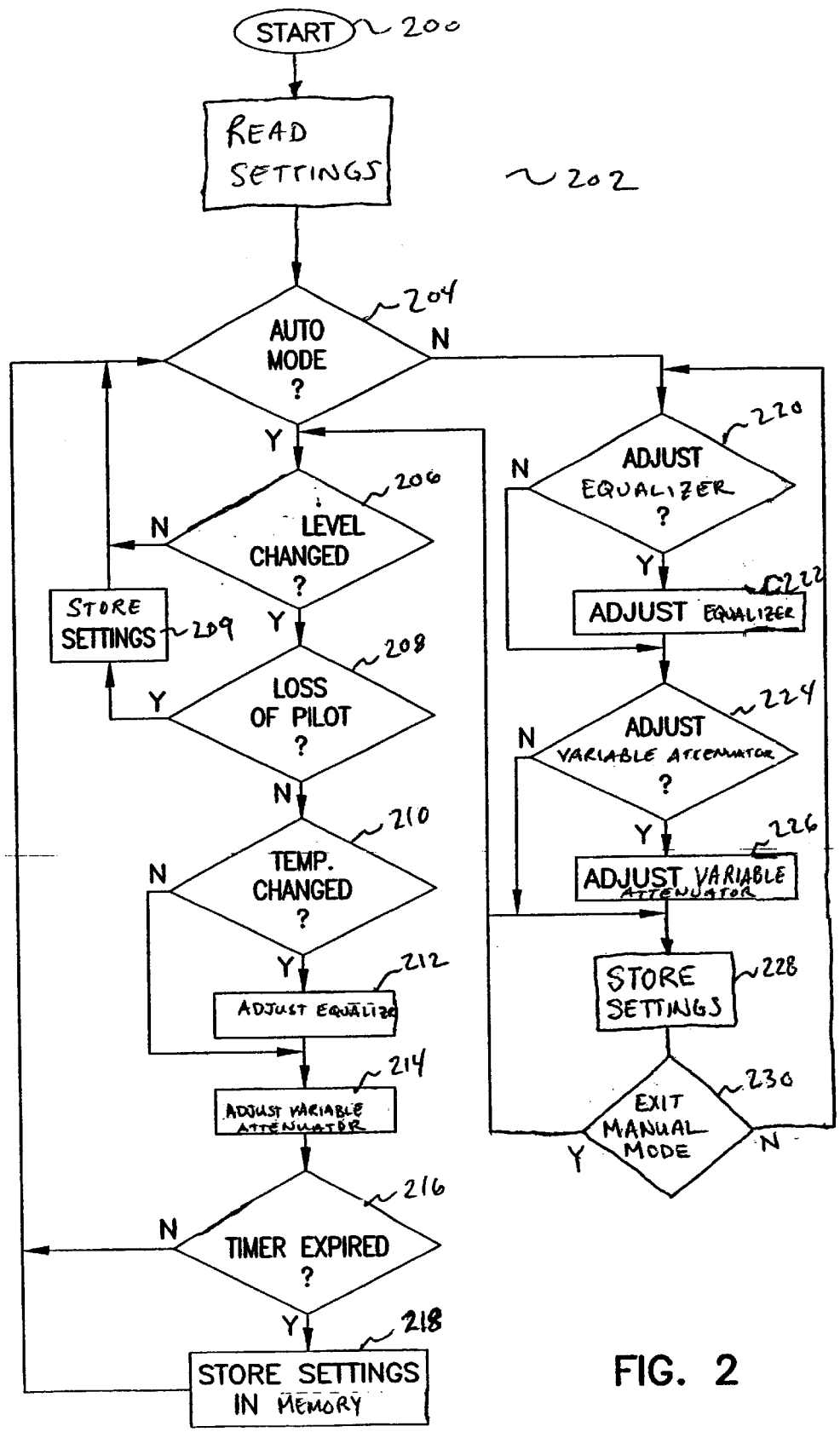
FIG. 2 is a flow chart that illustrates one embodiment of a process for providing automatic gain control in a network amplifier according to the teachings of the present invention.

Processor 120 generates control signals for variable equalizer 110 and variable attenuator 112. These control signals are provided to variable equalizer 110 and variable attenuator 112 through digital to analog converters (DACs) 126. FIG. 2, described in more detail below, provides one embodiment of a process for generating the control signals for processor 120.

C. Operation

In operation, network amplifier 100 of FIG. 1 provides automatic gain control for signals in signal path 102. Downstream signals are received at port 1. The signals are amplified by amplifiers 108 and 114. Variable attenuator 112 and variable equalizer 110 also affect the amplification and other characteristics of signals on signal path 102.

Monitoring circuit 116 monitors signals on signal path 102. These signals are provided to RF detector 118 that detects the level of the signals on signal path 102. The level information is provided to processor 120. Processor 120 uses the level information, a sensed temperature and data stored in memory 124 to create signals for adjusting the operation of variable equalizer 110 and variable attenuator 112 to assure that the signals provided at port 2 of network amplifier 100 fall within specified parameters.

D. Process for Generating Control Signals

FIG. 2 is a flow chart that illustrates one embodiment of a process for providing automatic gain control in a network amplifier according to the teachings of the present invention. The method begins at block 200.

At block 202, the method reads reference settings of the network amplifier. For example, the method reads the current settings for control signals provided to a variable equalizer and a variable attenuator pad. Further, the method reads current operating conditions such as the environmental temperature of the network amplifier. Finally, in one embodiment, the method reads a value to determine whether the operation of the automatic gain control circuit is in automatic (auto) or manual mode.

At block 204, the method determines whether the read value indicates auto or manual mode. When the value indicates auto mode, the method proceeds to automatically adjust the variable attenuator and variable equalizer circuits to assure that the network amplifier stays within prescribed operating conditions. At block 206, the method determines whether the level has changed by more than a specified amount for the signal in the signal path of the network amplifier. For example, in one embodiment, the method looks for a change of more than 0.2 dB in a pilot tone before returning a positive result for this inquiry. If the level has not changed, the method loops back to block 204 and monitors the level again.

If the level of the signal in the signal path has changed by a sufficient amount, then the methods proceeds to block 208 and determines whether the pilot has been lost based on, for example, a change in the derivative of the level with respect to time. If so, the last good settings are applied from memory at block 209 and the method returns to block 204. Appropriate alarms are also sent back to the head end.

If the pilot has not been lost, then the method proceeds to block 210 and begins the assessment procedure to determine new control signals for the variable equalizer and variable attenuator circuits. At block 210, the method determines whether the operating temperature of the network amplifier has changed. If the temperature has changed by at least a threshold amount, then the method knows that the characteristics of the cable plant have changed, e.g., the tilt of the cable changes with sufficient change in operating temperature. The method uses this change in temperature to generate control signals for the variable equalizer at block 212. In one embodiment, the method bases the new settings for the variable equalizer on the fact that a 20 degree change in temperature results in a 2 percent change in the level of signals in the cable.

On the other hand, if the temperature has not changed by a sufficient amount at block 210, the method avoids adjusting the equalizer and focuses solely on the variable attenuator.

At block 214, the method adjusts the control signals for the variable attenuator. For example, the method determines the difference between the monitored level and the expected level of the signals in the signal path. Based on this difference, the method looks for values in a look-up table for control signals for an attenuation level for the variable attenuator to account for the difference. If the temperature has changed, then the method also considers effects of changes to the variable equalizer in selecting new settings for the variable attenuator.

The method of FIG. 2 also uses a timer to control storage of the last good settings for the method. At block 216, the method determines whether the timer has expired since the storage of the last good settings. In one embodiment, the timer comprises a five minute timer although a timer of another duration may be used. The duration of the timer is selected to reduce the number of times that data is stored in a programmable read only memory circuit, e.g., an electrically erasable programmable read only memory (EEPROM) circuit, used to store the last good settings. If the timer has expired, the settings are stored in block 218 and the method returns to block 204. If the timer has not expired, then the method returns to block 204.

If at block 204 the values indicate that the method is to operate in manual mode, the method proceeds to block 220. In manual mode, the control signals fed to the variable equalizer and the variable pad can be directly specified. At block 220, the method determines whether the command for adjusting the equalizer has been entered. If so, the method adjusts the settings for the equalizer at block 222 proceeds to block 224. If not, the method skips block 222 and proceeds directly to block 224.

At block 224, the method determines whether a command was received to adjust the variable attenuator. If so, the method adjusts the settings for the variable attenuator at block 226. If not, the method skips block 226 and proceeds directly to block 228 and stores the current settings in memory.

At block 228, the method determines whether to exit manual mode. If not, the method returns to block 220. Otherwise, the method exits manual mode and returns to block 206.

II. Alternative Embodiment of a Network Amplifier

Figure 3:
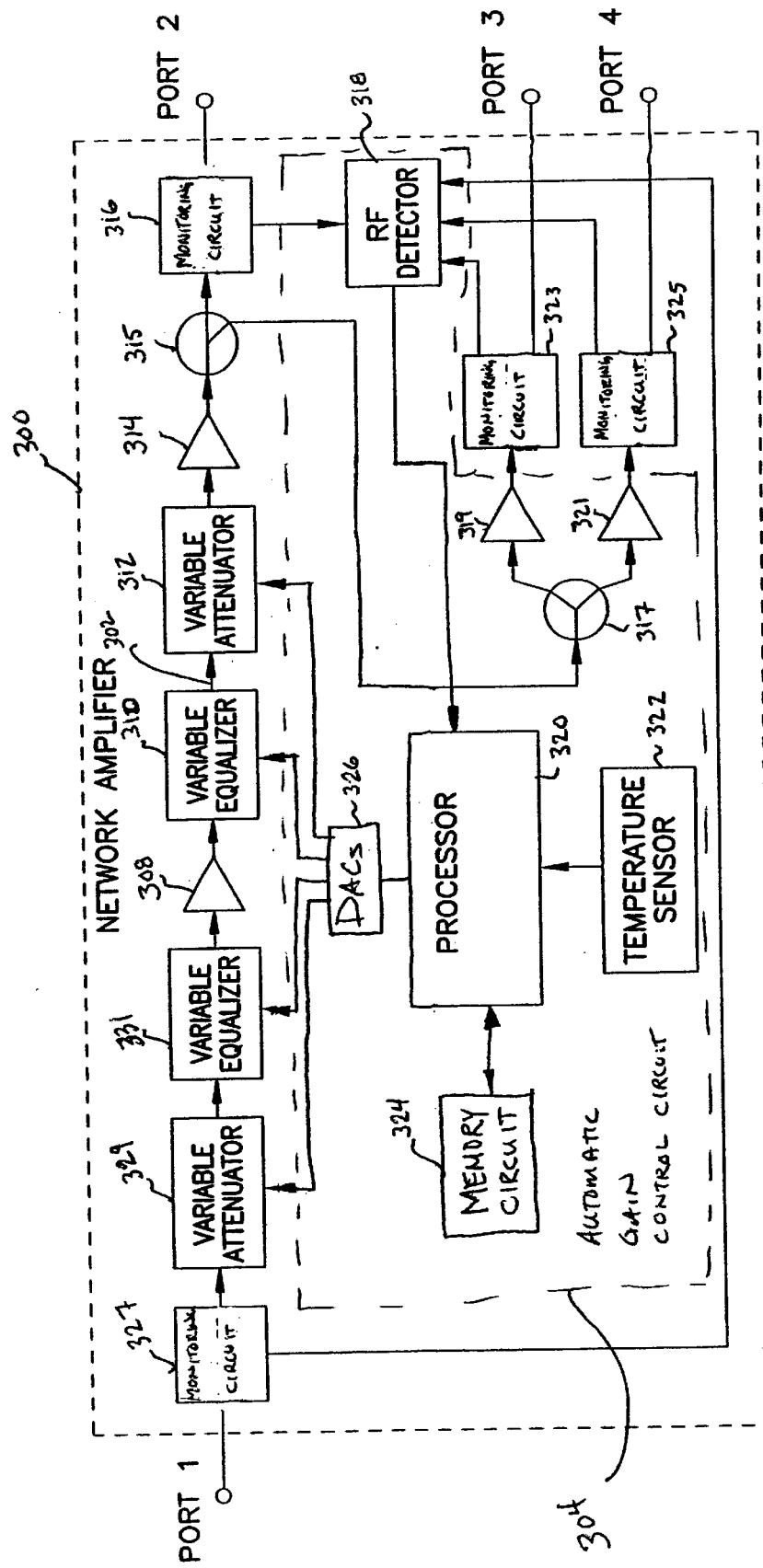
FIG. 3 is a block diagram of one embodiment of a network amplifier constructed according to the teachings of the present invention.

FIG. 3 is a block diagram of one embodiment of a network amplifier indicated generally at 300 and constructed according to the teachings of the present invention. Network amplifier 300 includes a main signal path 302 between PORT 1 and PORT 2. In this embodiment, network amplifier 300 also includes additional ports PORT 3 and PORT 4. These ports receive signals from signal path 302 via splitters 315 and 317. The slope and gain of signal path 302 are controlled by automatic gain control circuit 304. Advantageously, automatic gain control circuit 304 includes microprocessor 320 that generates control signals as needed to adjust the gain and slope in signal path 302 to keep network amplifier 300 operating within specified parameters. Further, microprocessor 320 can generate the control signals based on monitored signals at any of ports PORT 1, PORT 2, PORT 3, or PORT 4.

A. The Signal Path

Signal path 302 passes signals between PORT 1 and PORT 2 of network amplifier 300. Network amplifier 300 is a bi-directional amplifier. For simplicity, however, FIG. 3 shows only the forward portion of signal path 302. It is understood, that signal path 302 also includes a reverse path for passing upstream signals from PORT 2, PORT 3, and PORT 4 to PORT 1.

Signal path 302 provides amplification, with adjustable gain and slope or tilt, for RF signals transported between PORT 1 and PORT 2, PORT 3, and PORT 4. Signal path 302 includes variable attenuator 329 and variable equalizer 331 that receive signals at PORT 1. Signal path 302 also includes amplifier stages 308 and 314 that are coupled in series with variable equalizer 310 and variable attenuator 312.

Variable equalizers 310 and 331 may be constructed as shown and described in commonly assigned, co-pending U.S. application Ser. No. 09/229,234 (the "'234 Application), entitled Variable Equalizer, and filed on Jan. 12, 1999. The '234 Application is incorporated herein by reference. Essentially, variable equalizers 310 and 331 are controlled by at least one control signal from automatic gain control circuit 304 to provide a specified tilt setting for network amplifier 300.

Variable attenuators 312 and 329 may be constructed as shown and described in co-pending U.S. Application Serial No. 60/142,267, entitled Variable Attenuator, and filed on Jul. 2, 1999 and co-pending U.S. application Ser. No. 09/609,076, entitled Variable Attenuator, and filed on even date herewith. Variable attenuator 312 and 329 are controlled by at least one control signal from automatic gain control circuit 304 to provide a specified attenuation to the signals in signal path 302.

Monitoring circuits 316, 323, 325, and 327 are coupled to signal path 302 to monitor RF signals. Advantageously, monitoring circuits 316, 323, 325, and 327 may be constructed as shown and described in commonly assigned, co-pending U.S. application Ser. No. 09/121,244 (the "'244 Application"), entitled Circuits and Methods For A Monitoring Circuit in a Network Amplifier, and filed on Jul. 23, 1998. Monitoring circuits 316, 323, 325, and 327 thus monitor the level of signals in signal path 302 without insertion loss associated with a conventional directional coupler. However, it is understood that a conventional circuit, such as a directional coupler, could be used to monitor the signals in signal path 302 with insertion loss.

B. Automatic Gain Control Circuit

In one embodiment, automatic gain control circuit 304 controls the gain and slope of signal path 302 of network amplifier 300. Automatic gain control circuit 304 includes RF detector 318 that measures the level of signals from one of monitoring circuits 316, 323, 325, and 327. RF detector 318 may be constructed as shown and described in co-pending U.S. application Ser. No. 60/142,288, entitled RF Detector, and filed on Jul. 2, 1999 and U.S. application Ser. No. 09/607,832, entitled High Dynamic Range RF Detector with Temperature Compensation, and filed on even date herewith.

Automatic gain control circuit 304 further includes processor 320, temperature sensor 322 and memory circuit 324. In one embodiment, processor 320, temperature sensor 322, and memory circuit 324 implement the functionality of the processor, sensor and memory of the RF detector shown and described in the cited applications for RF detector 318. Thus, RF detector 318 may include a diode detector circuit that provides raw data to processor 320. Processor 320 processes the data from RF detector 318 to produce a value for the level of the signal in signal path 302 as described in the cited applications. In one embodiment, temperature sensor 322 comprises a thermistor.

Processor 320 generates control signals for variable equalizers 310 and 331 and variable attenuators 312 and 329. These control signals are provided to variable equalizers 310 and 331 and variable attenuators 312 and 329 through digital to analog converters (DACs) 326.

C. Operation

In operation, network amplifier 300 of FIG. 1 provides automatic gain control for signals in signal path 302. Downstream signals are received at PORT 1. The signals are amplified by amplifiers 308 and 314. Variable attenuators 312 and 329 and variable equalizers 310 and 331 also affect the amplification and other characteristics of signals on signal path 302.

One of the monitoring circuits 316, 323, 325, and 327 monitors signals on signal path 302. These signals are provided to RF detector 318 that detects the level of the signals on the selected portion of signal path 302. The level information is provided to processor 320. Processor 320 uses the level information, a sensed temperature and data stored in memory 324 to create signals for adjusting the operation of variable equalizers 310 and 331 and variable attenuators 312 and 329 to assure that the signals provided at PORT 2, PORT 3 and PORT 4 of network amplifier 300 fall within specified parameters.

III. Further Embodiment of an Amplifier

Figure 4:
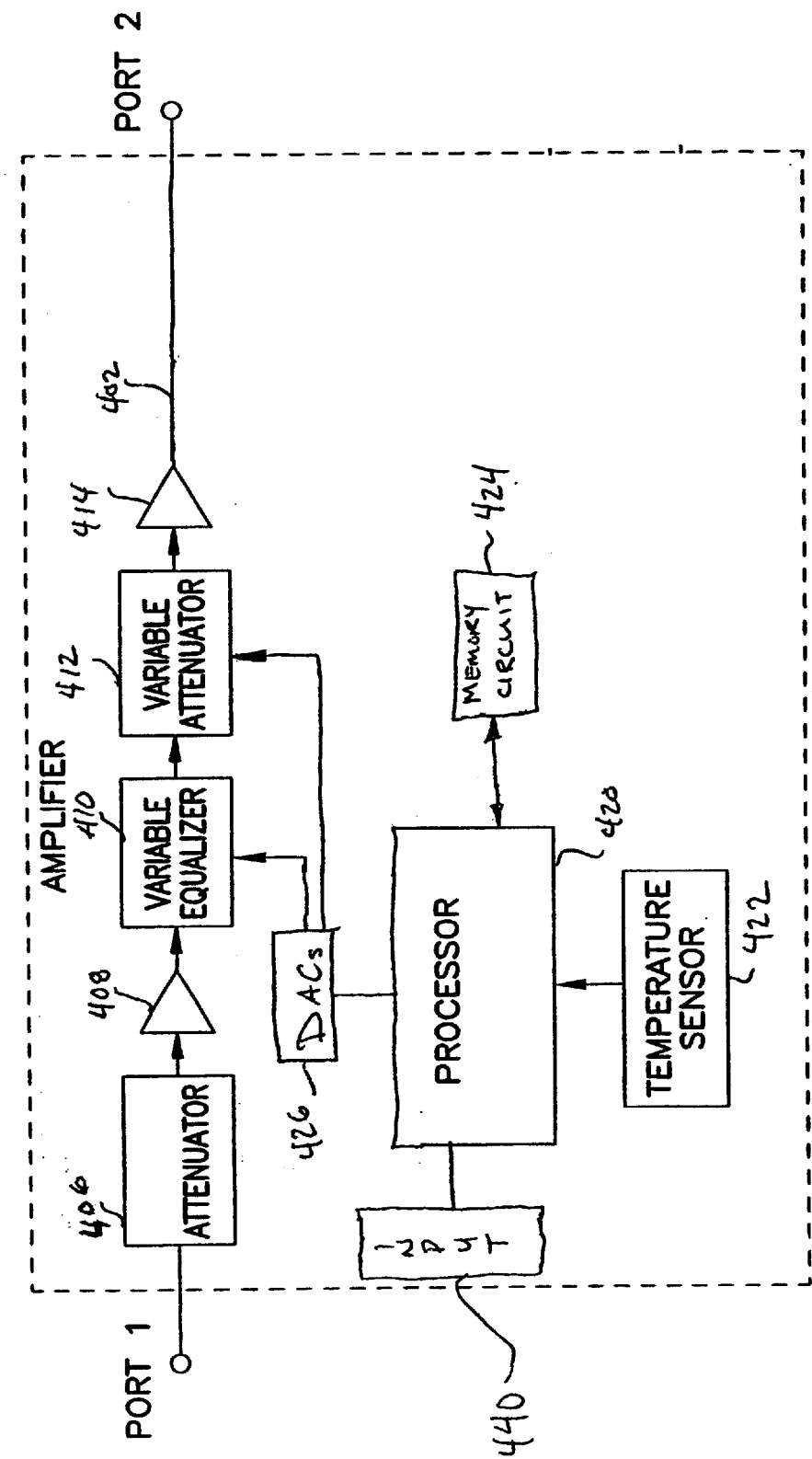
FIG. 4 is a block diagram of another embodiment of a network amplifier constructed according to the teachings of the present invention.

FIG. 4 is a block diagram of a further embodiment of an amplifier, indicated generally at 400, and constructed according to the teachings of the present invention. Amplifier 400 includes a main signal path 402 between PORT 1 and PORT 2. The slope and gain of signal path 402 are controlled by microprocessor 420. Microprocessor 420 generates control signals as based on inputs from input 440 to adjust the gain and slope in signal path 402. Although not shown, amplifier 400 also may include automatic gain control circuitry as shown in FIG. 1 to control the gain and slope of signal path 402 based on the data input into input 440 to keep amplifier 400 operating within specified parameters.

A. The Signal Path

Signal path 402 passes signals between PORT 1 and PORT 2 of amplifier 400. Amplifier 400 is a bi-directional amplifier. For simplicity, however, FIG. 4 shows only the forward portion of signal path 402. It is understood, that signal path 402 also includes a reverse path for passing upstream signals from PORT 2 to PORT 1.

Signal path 402 provides amplification, with adjustable gain and slope or tilt, for RF signals transported between PORT 1 and PORT 2. Signal path 402 includes attenuator 406 that receives signals at PORT 1. Signal path 402 also includes amplifier stages 408 and 414 that are coupled in series with variable equalizer 410 and variable attenuator 412 between attenuator 406 and PORT 2.

Variable equalizer 410 is constructed as shown and described in commonly assigned, co-pending U.S. application Ser. No. 09/229,234 (the "'234 Application), entitled Variable Equalizer, and filed on Jan. 12, 1999. The '234 Application is incorporated herein by reference. Essentially, variable equalizer 410 is controlled by at least one control signal from processor 420 through digital to analog converters (DACs) 426 to provide a specified tilt setting for amplifier 400.

Variable attenuator 412 is constructed as shown and described in co-pending U.S. Application Serial No. 60/142,267, entitled Variable Attenuator, and filed on Jul. 2, 1999 and co-pending U.S. application Ser. No. 09/609,076, entitled Variable Attenuator, and filed on even date herewith. Variable attenuator 412 is controlled by at least one control signal from processor 420 through DACs 426 to provide a specified attenuation to the signals in signal path 402.

B. Gain Control

In one embodiment, the gain is path 402 is controlled based on data provided to input 440. Input 440 may include, for example, mechanical up/down switches, an RS 485 interface, a wireless link, an infrared link, push buttons, dials, or other appropriate data entry device that allows a desired level for the gain and slope of the signals in signal path 402 to be provided to processor 420. Input 440 can also be placed under control of the output of a programmed computer to allow for remote control of the amplifier.

Processor 420 generates control signals for variable equalizer 410 and variable attenuator 412. These control signals are provided to variable equalizer 410 and variable attenuator 412 through digital to analog converters (DACs) 426.

C. Operation

In operation, amplifier 400 receives inputs for gain and/or tilt settings at input 440. These inputs are provided to processor 420. Processor 420 generates control signals for variable equalizer 410 and variable attenuator 412 to control the signal in signal path 402 to fall within the parameters specified by input 440.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, processor 320 can control characteristics of signal path 302 other than just the gain and slope.

What is claimed is:

1. A network amplifier, comprising:
    a variable equalizer having at least one control input;
    a variable attenuator having at least one control input;
    at least one amplifier circuit, coupled in series with the variable equalizer and the variable attenuator in a signal path of the network amplifier; and
    an automatic gain control circuit with a processor that monitors signals in the signal path and generates control signals for the control input of the variable equalizer and the control input of the variable attenuator to control at least one characteristic of the network amplifier.

2. The network amplifier of claim 1, wherein the variable equalizer includes:
    a two port bridge "T" network having a number of independently controllable top and bottom branches; and
    wherein the frequency response of the variable equalizer is controlled by selectively and independently adjusting frequency breakpoints of the top and bottom branches based on the control signals from the processor.

3. The network amplifier of claim 1, wherein the variable attenuator includes:
    at least three PIN diodes coupled to provide attenuation in the signal path; and
    at least two current sources that are coupled to provide first and second bias current levels to the PIN diodes based on the control signals from the processor to establish a selected attenuation level.

4. The network amplifier of claim 1, wherein the automatic gain control circuit further includes a memory circuit that stores data used to generate the control signals for the variable attenuator and the variable equalizer.

5. The network amplifier of claim 4, wherein the memory circuit comprises a non-volatile memory circuit.

6. The network amplifier of claim 4, wherein the automatic gain control circuit further includes:
an RF detector coupled to the signal path through a monitoring circuit and coupled to the processor,
wherein the processor corrects the output of the RF detector based on data stored in the memory and the output of a temperature sensor, and
wherein the processor uses the corrected data from the RF detector in generating the control signals for the variable equalizer and the variable attenuator.

7. The network amplifier of claim 6, and further including:
at least one additional signal path coupled to the signal path, and
a monitoring circuit coupled to the additional signal path that provides signals through the RF detector to the processor such that the automatic gain control circuit controls the variable attenuator and the variable equalizer based on signals in either the signal path or the additional signal path.

8. The network amplifier of claim 1, wherein the automatic gain control circuit controls slope and gain of the signal path.

9. A method for controlling gain and slope of a network amplifier, the method comprising:
monitoring the signal level of a signal in a signal path of the network amplifier;
monitoring an operating temperature for the network amplifier;
when the signal level changes by a selected amount, selectively adjusting a control input to a variable attenuator; and
when the temperature changes by a selected amount, selectively adjusting a control signal for a variable equalizer.

10. The method of claim 9, wherein monitoring the operating temperature comprises monitoring the operating temperature with a thermistor.

11. The method of claim 9, and further comprising storing the values for the control signals for the variable attenuator and for the variable equalizer.

12. The method of claim 11, and further comprising:
determining when a pilot is lost; and
when the pilot is lost, using the stored values for the control signals.

13. An amplifier, comprising:
a variable equalizer having at least one control input;
a variable attenuator having at least one control input;
at least one amplification circuit, coupled in series with the variable equalizer and the variable attenuator in a signal path of the amplifier;
an input device that is adapted to receive an indication of at least one desired characteristic for signals in the signal path; and
a processor, responsive to the control input device, wherein the processor is adapted to generate control signals for the variable equalizer and the variable attenuator to achieve the at least one desired characteristic selected by the input device.

14. The amplifier of claim 13, wherein the input device is one of at least one mechanical up/down switch, an RS 485 interface, a wireless link, an infrared link, push buttons, and dials.

15. The amplifier of claim 13, wherein the input device is adapted to receive commands from a remote computer.

16. The amplifier of claim 13, wherein the variable equalizer includes:
a two port bridge "T" network having a number of independently controllable top and bottom branches; and
wherein the frequency response of the variable equalizer is controlled by selectively and independently adjusting frequency breakpoints of the top and bottom branches based on the control signals from the processor.

17. The amplifier of claim 13, wherein the variable attenuator includes:
at least three PIN diodes coupled to provide attenuation in the signal path; and at least two current sources that are coupled to provide first and second bias current levels to the PIN diodes based on the control signals from the processor to establish a selected attenuation level.

* * * * *